United States Patent
Yoon et al.

(10) Patent No.: US 10,490,237 B2
(45) Date of Patent: Nov. 26, 2019

(54) DATA STORAGE DEVICE AND METHOD OF OPERATING THE SAME

(71) Applicant: SAMSUNG ELECTRONICS CO., LTD., Suwon-si, Gyeonggi-Do (KR)

(72) Inventors: Jong Hyun Yoon, Hwaseong-si (KR); Sung Won Jeong, Suwon-si (KR); Hyun Seok Cha, Osan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/014,443

(22) Filed: Jun. 21, 2018

(65) Prior Publication Data
US 2019/0130947 A1    May 2, 2019

(30) Foreign Application Priority Data
Nov. 1, 2017    (KR) .................... 10-2017-0144846

(51) Int. Cl.
| | | |
|---|---|---|
| G11C 11/00 | (2006.01) | |
| G11C 7/10 | (2006.01) | |
| G06F 11/10 | (2006.01) | |
| G06F 13/16 | (2006.01) | |
| G06F 12/02 | (2006.01) | |

(52) U.S. Cl.
CPC ........ *G11C 7/1006* (2013.01); *G06F 11/1068* (2013.01); *G06F 12/0246* (2013.01); *G06F 13/1673* (2013.01); *G11C 11/005* (2013.01); G11C 2207/2236 (2013.01); G11C 2207/2245 (2013.01)

(58) Field of Classification Search
CPC ............... G11C 7/1006; G11C 11/005; G11C 2207/2245; G11C 2207/2236; G06F 13/1673; G06F 11/1068; G06F 12/0246
See application file for complete search history.

(56) References Cited

U.S. PATENT DOCUMENTS

| | | |
|---|---|---|
| 8,918,580 B2 | 12/2014 | Cheon |
| 9,116,631 B2 | 8/2015 | Choi et al. |
| 9,208,074 B2 | 12/2015 | Cheng |
| 9,304,911 B2 | 4/2016 | Choi |
| 9,396,108 B2 | 7/2016 | Kim et al. |
| 9,442,841 B2 | 9/2016 | Minamimoto |
| 9,483,210 B2 * | 11/2016 | Olbrich ............... G06F 13/1657 |
| 9,563,382 B2 | 2/2017 | Hahn et al. |
| 2010/0162055 A1 | 6/2010 | Morita et al. |

* cited by examiner

*Primary Examiner* — David Lam
(74) *Attorney, Agent, or Firm* — F. Chau & Associates, LLC

(57) ABSTRACT

A data storage device includes a first memory device having a buffer region including a general region and a host access region, a second memory device, and a controller. The first memory device is directly accessible by the host. The controller controls the first memory device or the second memory device to store data provided from the host. The controller stores the data in the host access region and generates metadata of the data, when the data provided from the host complies with a predetermined condition.

20 Claims, 12 Drawing Sheets

DATA STORAGE DEVICE AND METHOD OF OPERATING THE SAME

CROSS-REFERENCE TO RELATED APPLICATION

This application claims priority under 35 U.S.C. 119 to Korean Patent Application No. 10-2017-0144846 filed on Nov. 1, 2017 in the Korean Intellectual Property Office, the disclosure of which is incorporated by reference in its entirety herein.

BACKGROUND

1. Technical Field

The present disclosure relates to a data storage device and a method of operating the same.

2. Discussion of Related Art

A semiconductor memory device is classified into a volatile memory device in which stored information is not retained supply of power is interrupted, and a nonvolatile memory device that maintains the stored information even when the supply of power is interrupted. NAND flash devices are widely used as nonvolatile memory devices. A data storage device including the NAND flash device includes, for example, a Solid State Drive (SSD).

The SSD including the NAND flash device can achieve a large storage capacity. However, the access speed of an SSD including the NAND flash device is low as compared to an SSD including a dynamic random access memory (DRAM).

Non-Volatile Memory Express (NVMe), which is a communication standard for nonvolatile memories, provides a standard for external hosts to read and write data into a DRAM located inside an SSD.

SUMMARY

At least one embodiment of the present inventive concept provides a data storage device with improved data input and output speed.

At least one embodiment of the present inventive concept provides a method of operating a data storage device with improved data input and output speed.

According to an exemplary embodiment of the present inventive concept, a data storage device includes a first memory device having a buffer region including a general region and a host access region, a second memory device, and a controller. The first memory device is directly accessible by the host. The controller controls the first memory device or the second memory device to store data provided from the host. The controller stores the data in the host access region and generates metadata based on the data, when the data provided from the host complies with a predetermined condition.

According to an exemplary embodiment of the present inventive concept, a data storage device includes a host which provides a data write command and data written by the data write command, a drive which stores the data provided from the host, and a switch which connects the host and the drive. The drive includes a first memory device, a second memory device, and a controller. The first memory device has a buffer region including a general region and a host access region. The controller controls the first memory device or the second memory device to store data provided from the host. When the data provided from the host complies with a predetermined condition, the controller stores the data in the host access region and generates metadata based on the data. The first memory device is directly accessible by the host.

According to an exemplary embodiment of the present inventive concept, a method of operating a data storage device includes a controller of the data storage device allocating a first part of a buffer region included in a first memory device of the data storage device as a general region and a second part of the buffer region as a host access region, the controller receiving a data write command and data from a host, the controller storing the data in the host access region, and generating metadata based on the data, when the data complies with a predetermined condition, the controller storing the data in the general region of the first memory device, when the data does not comply with the predetermined condition, and the controller storing data stored in the host access region together with the metadata in a second memory device. The write command includes an address of the first memory device.

According to an exemplary embodiment of the present inventive concept, a data storage device includes a volatile memory device including a buffer region, a nonvolatile memory device, and a controller configured to allocate a first part of the buffer region as a general region and a second part of the buffer region as a host access region. The controller stores first data from a host in the general region and stores second data from the host in the host access region. The controller prevents the first data from being copied from the buffer region to the nonvolatile memory device and allows the second data to be copied from the buffer region to the nonvolatile memory device.

BRIEF DESCRIPTION OF THE DRAWINGS

The inventive concept will become more apparent by describing in detail exemplary embodiments thereof with reference to the attached drawings, in which.

DETAILED DESCRIPTION OF THE EXEMPLARY EMBODIMENTS

Figure 1:
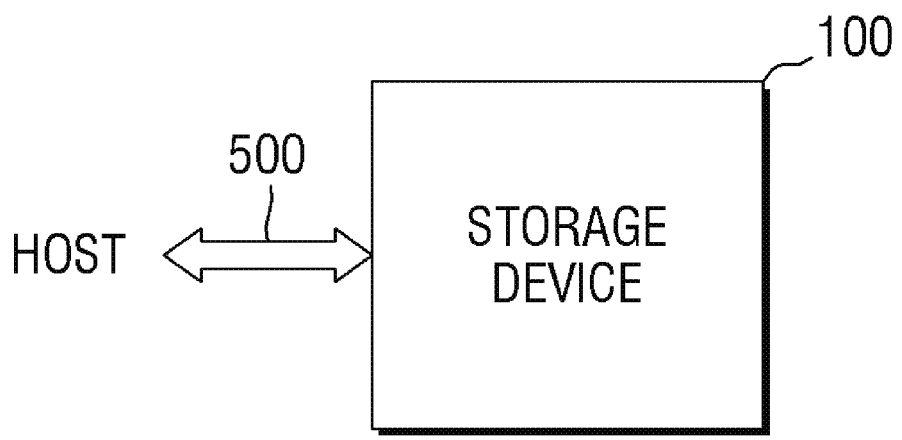
FIG. 1 is a block diagram illustrating a data storage device according to an exemplary embodiment of the present inventive concept.
Figure 2:
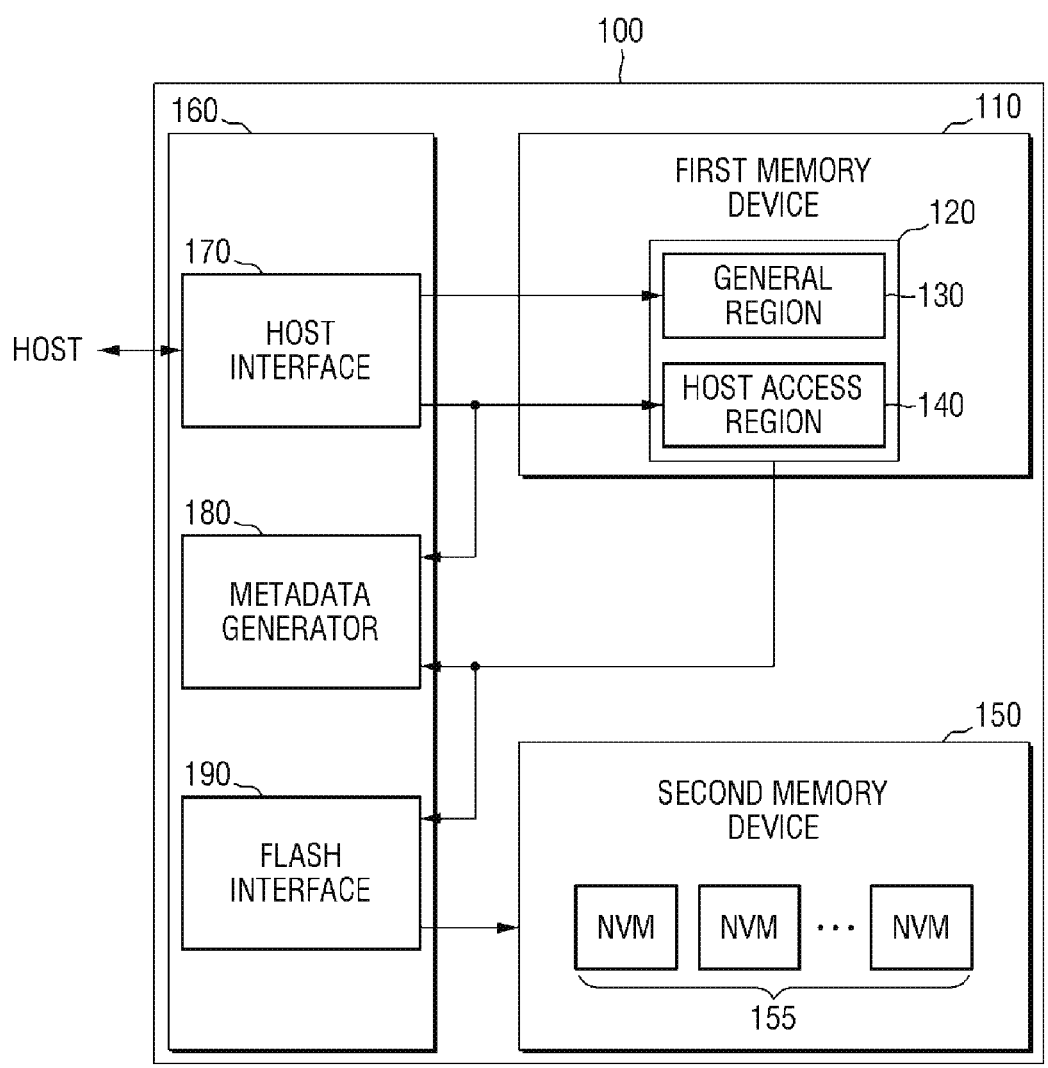
FIG. 2 is a block diagram illustrating the data storage device of FIG. 1 in more detail.

FIG. 1 is a block diagram illustrating a data storage device according to an exemplary embodiment of the present inventive concept, and FIG. 2 is a block diagram illustrating the data storage device of FIG. 1 in more detail.

Referring to FIGS. 1 and 2, a data storage device 100 according to an exemplary embodiment of the present inventive concept includes a first memory device 110 (e.g., a volatile memory device), a second memory device 150 (e.g., a nonvolatile memory device), and a controller 160 (e.g., a control circuit).

The data storage device 100 may be connected to a host. The data storage device 100 may receive read, program, and erase commands from the host, and may execute operations corresponding to each received command.

A channel 500 connects the data storage device 100 and the host. The channel 500 may be used to exchange data between the host and the data storage device 100. For example, the channel 500 may include at least one interface among a Universal Serial Bus (USB), a Small Computer System Interface (SCSI), a PCI express, an ATA, a PATA (Parallel ATA), a SATA (Serial ATA), a SAS (Serial Attached SCSI), and a NVMe (Non Volatile Memory express), but the present disclosure is not limited thereto.

In the present specification, the channel 500 is described as connecting the host and the data storage device 100, while conforming to the NVMe standard. Specifically, the channel 500 may be configured to comply with a standard of NVMe 1.2 or higher, but it is not limited thereto.

When the channel 500 is configured to comply with the standard of NVMe 1.2 or higher, the data storage device 100 is also a storage device which supports the standard of NVMe 1.2 or higher.

The channel 500 may include a switch for supporting the data transfer of the PCIe standard.

The data storage device 100 may be, for example, a solid state drive (SSD) including a first memory device 110 and a second memory device 150.

In contrast, the data storage device 100 may be a memory card, such as a PC card, a personal computer memory card international association (PCMCIA) card, a compact flash card (CF), a smart media card (SM, SMC), a memory stick, a multimedia card (MMC, RS-MMC, MMCmicro), an SD card (SD, miniSD, microSD, SDHC), and a universal flash storage device (UFS). However, the present inventive concept is not limited thereto.

The first memory device 110 may store data provided from the host. The first memory device 110 may include, for example, volatile memory. Specifically, the first memory device 110 may include Dynamic Random Access Memory (DRAM) or Static Random Access Memory (SRAM), but the present inventive concept is not limited thereto.

In an exemplary embodiment, when the first memory device 110 includes, for example, a DRAM or an SRAM, the operating speed of the first memory device 110 is higher than the operating speed of the second memory device 150. In an exemplary embodiment, the storage capacity of the first memory device 110 is smaller than the storage capacity of the second memory device 150.

In an embodiment, the first memory device 110 operates as a kind of cache memory or buffer in the data storage device 100. Therefore, the data storage device 100 may temporarily store the data in the first memory device 110, before it is written to the second memory device 150. The data storage device 100 may temporarily store data read from the second memory device 150, in the first memory device 110 before it is sent to the Host.

The first memory device 110 includes a buffer region 120 that can be directly accessed from the host. Further, the first memory device 110 may include regions other than the buffer region 120. That is, the first memory device 110 may include a buffer region 120 that is directly accessed from the host, and other regions that are not directly accessed from the host.

The buffer region 120 may be allocated within a storage space in the first memory device 110. The data storage device 100 may include a register for defining a buffer region 120 in the first memory device 110. An address in which the buffer region 120 starts in the first memory device 110 and/or the dimension of the buffer region 120 may be stored in the register, but the present inventive concept is not limited thereto.

When the data storage device 100 is configured to comply with the standard of NVMe 1.2 or higher, the buffer region 120 may be a Controller Memory Buffer (CMB). However, the present inventive concept is not limited thereto.

The buffer region 120 includes a general region 130 and a host access region 140. The general region 130 stores data that is not provided to the second memory device 150. The data stored in the general region 130 may include, for example, kernel data. Kernal data may be used by an operating system. In an embodiment, the controller 160 designates a general region 130 for data that is not provided to the second memory device 150 and may provide the general region to the first memory device 110.

The host access region 140 stores data that can be provided to the second memory device 150. In an embodiment, the host access region 140 temporarily stores data that is directly requested by the host to be recorded on the second memory device 150. For example, data of the host can be temporally stored in the host access region 140 before it is stored in the second memory device 150. The data stored in the host access region 140 may include, for example, application data or user data, but the present inventive concept is not limited thereto.

The data storage device 100 may store data conforming to a predetermined condition in the host access region 140. The predetermined condition may include, for example, a data chunk size, and a data alignment size.

For example, the data storage device 100 may store only data having a data chunk size of 4 KB in the host access region 140. Although data having a data chunk size of 4 KB is determined to be stored in the host access region 140, when data of other sizes (for example, 2 KB, 8 KB, etc.) is provided from the host, the data storage device 100 may return an error message to the host.

Alternatively, the data storage device 100 may store only data aligned at 4 KB in the host access region 140. Although the data aligned at 4 KB is determined to be stored in the host access region 140, when data aligned at other sizes (for example, 8 KB etc.) is provided from the host, the data storage device 100 may return an error message to the host.

The data stored in the host access region 140 may be required to satisfy a plurality of conditions. That is, the data stored in the host access region 140 may be data aligned to 4 KB with a data chunk size of 4 KB.

The second memory device 150 may also store data provided from the host. The second memory device 150 may include, for example, a nonvolatile memory 155. The second memory device 150 may include a NAND flash memory, but is not limited thereto.

For example, the second memory device 150 may include one of Phase-change RAM (PRAM), Ferroelectronic RAM (FRAM), Resistive RAM (RRAM), or Magnetoresistive RAM (MRAM). That is, the second memory device 150 may also semi-permanently store data, using a phase change material, a ferroelectric material, a resistive material, and a magnetic tunnel junction material, as a storage element.

The second memory device 150 may receive data, which is provided by the first memory device 110 from the host and temporarily stored, and may store the data therein. For example, the data received from the host may be temporarily stored in the first memory device 110 before it is sent to the second memory device 150. Alternatively, the second memory device 150 may provide the data, which is read to be provided to the host, to the first memory device 110, and the first memory device 110 may temporarily store the data therein, and then, may send the data to the host again. For example, data read out of the second memory device 150 may be temporarily stored in the first memory device 110 before it is sent to the host.

The controller 160 may control the operation of the data storage device 100. Specifically, the controller 160 may control the operation of the first memory device 110 and the second memory device 150 in the data storage device 100. The specific operation of the first memory device 110 and the second memory device 150 controlled by the controller 160 will be described below.

The controller 160 includes a host interface 170, a metadata generator 180, and a flash interface 190. The components in the controller 160 illustrated in FIG. 2 are the minimum components for explaining the operation of the data storage device 100 and the controller 160. That is, the controller 160 may include many components other than the host interface 170, the metadata generator 180 and the flash interface 190.

The host interface 170 may exchange data between the host and the controller 160. The host interface 170 may receive data provided to the data storage device 100 by the host, and, conversely, may transmit data provided by the data storage device 100 to the host.

The data provided from the host may be transmitted to the first memory device 110 via the host interface 170. The host interface 170 may be connected to each of the general region 130 and the host access region 140 included in the buffer region 120 inside the first memory device 110. In an embodiment, a first signal line connects the host interface 170 to a first input of the first memory device 100 for exchanging data with the general region 130, and a second signal line connects the host interface 170 to a second input of the first memory device 100 for exchanging data with the host access region 140.

An exemplary detailed configuration of the host interface 170 will be described in more detail with reference to FIG. 3.

Figure 3:
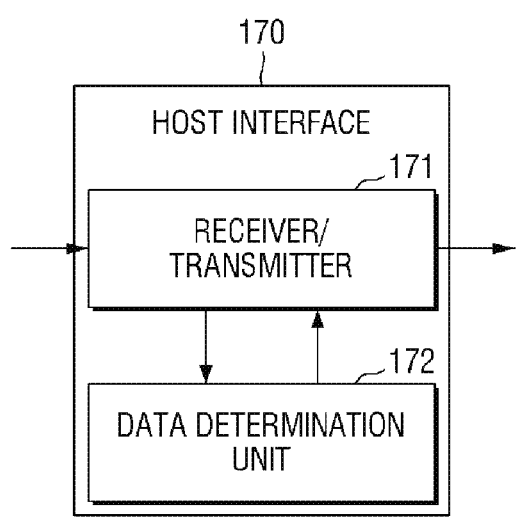
FIG. 3 is a block diagram for explaining the configuration of a host interface of FIG. 2.

FIG. 3 is a block diagram for explaining a configuration of the host interface 170 of FIG. 2.

Referring to FIG. 3, the host interface 170 includes a transmitter/receiver 171 (e.g., a transceiver) and a data determination unit 172 (e.g., a circuit configured to determine the type of the data).

The transmitter/receiver 171 may receive the data provided to the data storage device 100 by the host, and conversely, the transmitter/receiver 171 may transmit the data provided by the data storage device 100 to the host. In order to determine the type of data provided to the data storage device 100 by the host, the transmitter/receiver 171 may provide the received data to the data determination unit 172.

In an embodiment, the data determination unit 172 determines the type of data provided from the transmitter/receiver 171. As described above, in an embodiment, the data provided to the host interface 170 for storing in the host access region 140 needs to satisfy predetermined conditions. In an embodiment, the data determination unit 172 determines whether the data chunk size of the data provided from the transmitter/receiver 171 coincides with a predetermined condition or whether the alignment of the data coincides with a predetermined condition. The data determination unit 172 may provide the determination result to the transmitter/receiver 171. In an embodiment, the data determination unit 172 is implemented by a comparator, an arithmetic logic unit, or one or more logic circuits to determine whether the data has a particular data chunk size or has a particular alignment.

Referring back to FIG. 2, the metadata generator 180 generates metadata based on data provided from the host. The metadata of the data generated by the metadata generator 180 may include, for example, an Error Correcting Code (ECC) for checking for the presence or absence of an error in the data provided from the host. In an embodiment, the metadata generator 180 is a circuit configured to generate an ECC based on input data.

The ECC may be, for example, an error correction code formed, using algorithms such as a Reed-Solomon code (RS), a Hamming code, a Cyclic Redundancy Code (CRC), and a Low Density Parity Check (LDPC).

The metadata generator 180 may generate the metadata based on data provided from the host to the first memory device 110. Alternatively, the metadata generator 180 may generate the metadata based on data provided from the first memory device 110 to the second memory device. A more detailed description thereof will be given later.

The flash interface 190 may be used to exchange data between the controller 160 and the second memory device 150. The flash interface 190 may transmit data provided by the controller 160 to the second memory device 150, and conversely, the flash interface 190 may receive data provided to the controller 160 by the second memory device 150.

Figure 4:
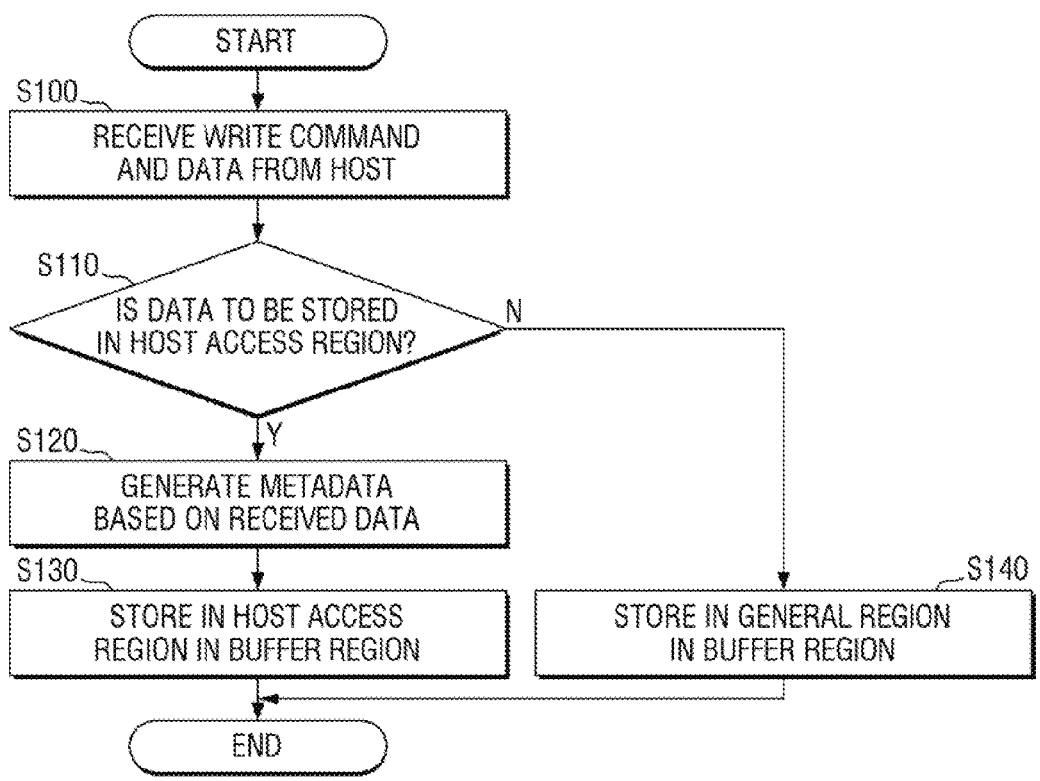
FIG. 4 is a flowchart illustrating the operation of the data storage device according to an exemplary embodiment of the present inventive concept.

FIG. 4 is a flowchart illustrating a method of operating the data storage device according to an exemplary embodiment of the present inventive concept.

Referring to FIG. 4, a method of operating a data storage device according to an exemplary embodiment of the present inventive concept includes receiving a write command and data from a host (S100), determining whether the data is to be stored in the host access region 140 (S110), generating metadata based on the received data when the data is to be stored in the host access region 140 (S120), storing the received data in the host access region 140 inside the buffer region 120 (S130), and storing the received data in the general region 130 in the buffer region 120 when the data is not to be stored in the host access region 140.

The write operation of the data storage device 100 will be described in more detail with reference to FIG. 5.

Figure 5:
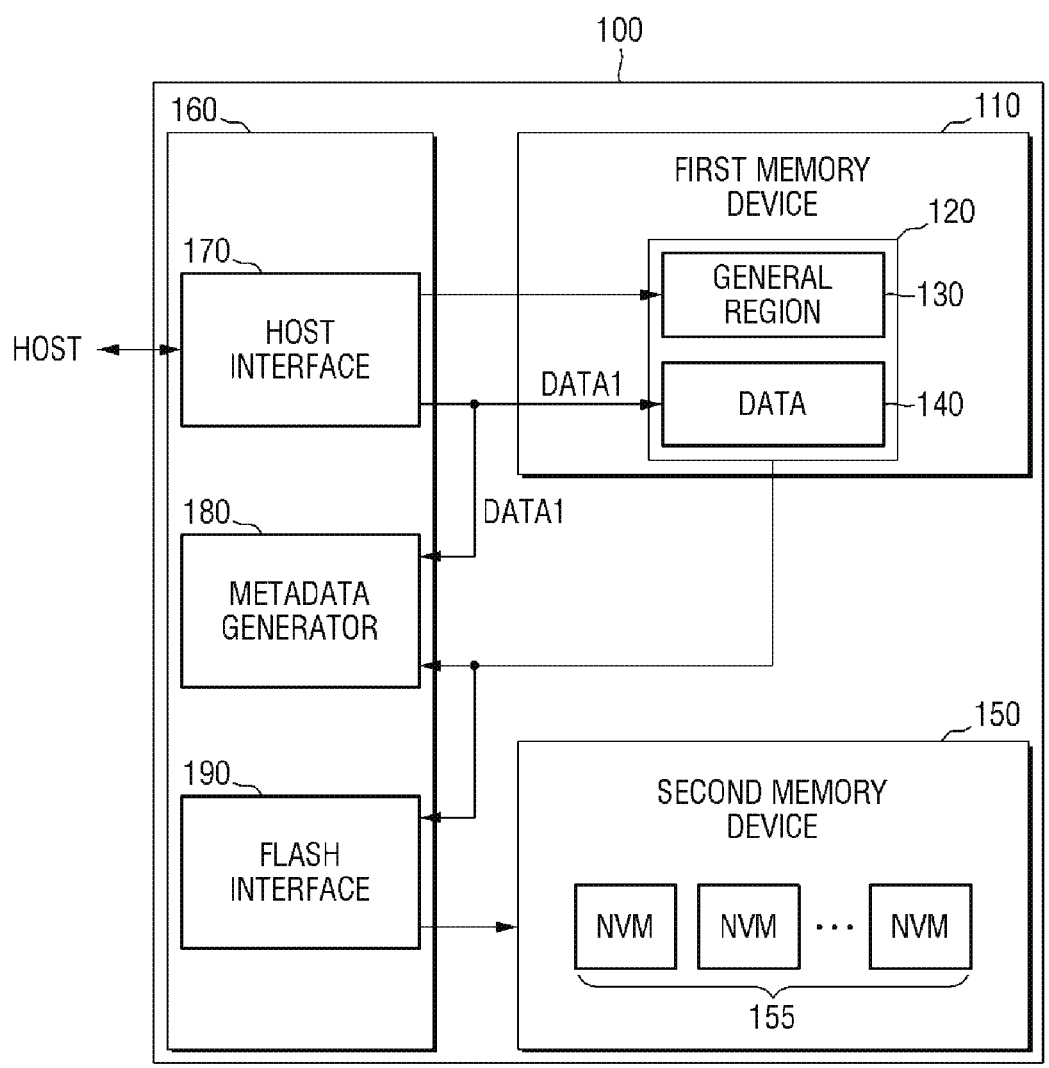
FIG. 5 is a block diagram for explaining the operation of the data storage device according to an exemplary embodiment of the present inventive concept.

FIG. 5 is a block diagram for explaining the operation of the data storage device according to an exemplary embodiment of the present inventive concept.

Referring to FIG. 5, the data storage device 100 receives a write command and data from the host (S100).

The host may provide the write command and data (DATA1) which is a target of the write operation to the data storage device 100. The write command may include the address of the first memory device 110. Specifically, the write command may include an address indicating the buffer region 120 in the first memory device 110.

The buffer region 120 includes a general region 130 and a host access region 140 as described above. Therefore, the address included in the write command provided by the host may indicate the general region 130 or the host access region 140 in the buffer region 120. For example, the address may indicate to a location within the general region 130 or a location within the host access region 140.

Further, the write command provided by the host to the data storage device 100 may include a predetermined condition of the data (DATA1) to be stored by the data storage device 100. Such a condition may specify, for example, that the data (DATA1) provided by the host has a data chunk size of 4 KB. Alternatively, the above condition may specify, for example, that the data (DATA1) provided by the host is aligned at 4 KB. For example, the write command may include a data field (e.g., one or more bits) that specifies the condition.

The controller 160 determines whether the received data (DATA1) needs to be stored in the general region 130 or the host access region 140, based on the write command provided from the host (S110).

The determination as to whether the data (DATA1) provided by the controller 160 needs to be stored in the general region 130 or the host access region 140 will be described in more detail with reference to FIG. 6.

In the write command received from the host by the data storage device 100, the condition in which the received data (DATA1) needs to be stored in the general region 130 or the host access region 140 may be present.

For example, when the data received from the host is kernel data, the data storage device 100 may determine that the deceived data needs to be stored in the general region 130. Or, when the data (DATA1) provided from the host is user data or application data, the data storage device 100 may determine that the received data needs to be stored in the host access region 140.

Such a determination process may be performed, by providing the received write command or the received data to the data determination unit 172 using the transmitter/receiver 171, and by determining that the data needs to be stored in the general region 130 or the host access region 140 based on the received write command or the received data using the data determination unit 172.

Figure 6:
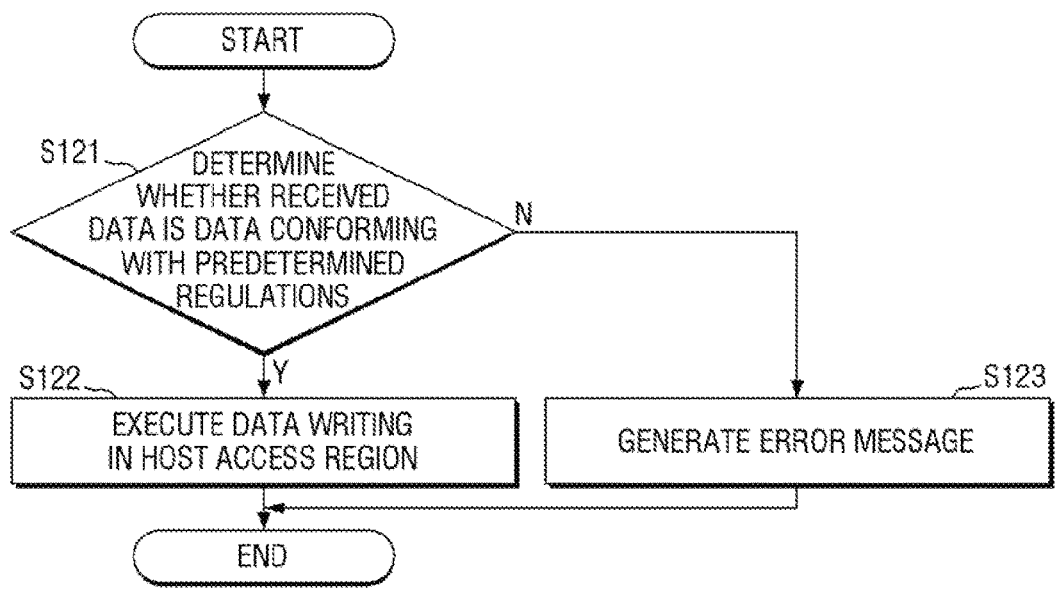
FIG. 6 is a flowchart illustrating the operation of the data storage device according to an exemplary embodiment of the present inventive concept.

FIG. 6 is a flow chart for explaining processing of received data with a data storage device according to an exemplary embodiment of the present inventive concept.

Referring to FIG. 6, the data storage device determines whether the received data (DATA1) is data conforming to a predetermined condition (S121), executes writing of the data (DATA1) to the access region 140 if the received data (DATA1) complies with the predetermined condition (S122), and generates an error message if the provided data (DATA1) does not comply with the predetermined condition (S123).

In an embodiment, the write command received by the data storage device 100 specifies that the data has a data chunk size of 4 KB, and when the data provided to the data storage device 100 by the host has the data chunk size of 4 KB, the data determination unit 172 determines that the received data complies with predetermined conditions. The controller 160 may execute writing of the data (DATA1) in the host access region 140. For example, the controller 160 may perform an operation that causes the data (DATA1) to be written to the host access region 140.

In an embodiment, the write command received by the data storage device 100 specifies that the data has the data chunk size of 4 KB. However, the data provided to the data storage device 100 by the host may have a data chunk size of 8 KB. In this case, the data determination unit 172 generates an error message, and the controller 160 may transfer the error message to the host.

Referring back to FIG. 4 and FIG. 5, in the case where it is determined that the received data is to be stored in the host access region 140, metadata based on the received data (DATA1) is generated (S120). The metadata generator 180 may generate metadata using the data (DATA1) provided from the transmitter/receiver 171.

In an exemplary embodiment, the metadata generator 180 generates an ECC formed, using algorithms such as a Reed-Solomon code (RS), a Hamming code, a Cyclic Redundancy Code (CRC), and a Low Density Parity Check (LDPC), on the received data (DATAS1), but it is not limited thereto.

Figure 7A:
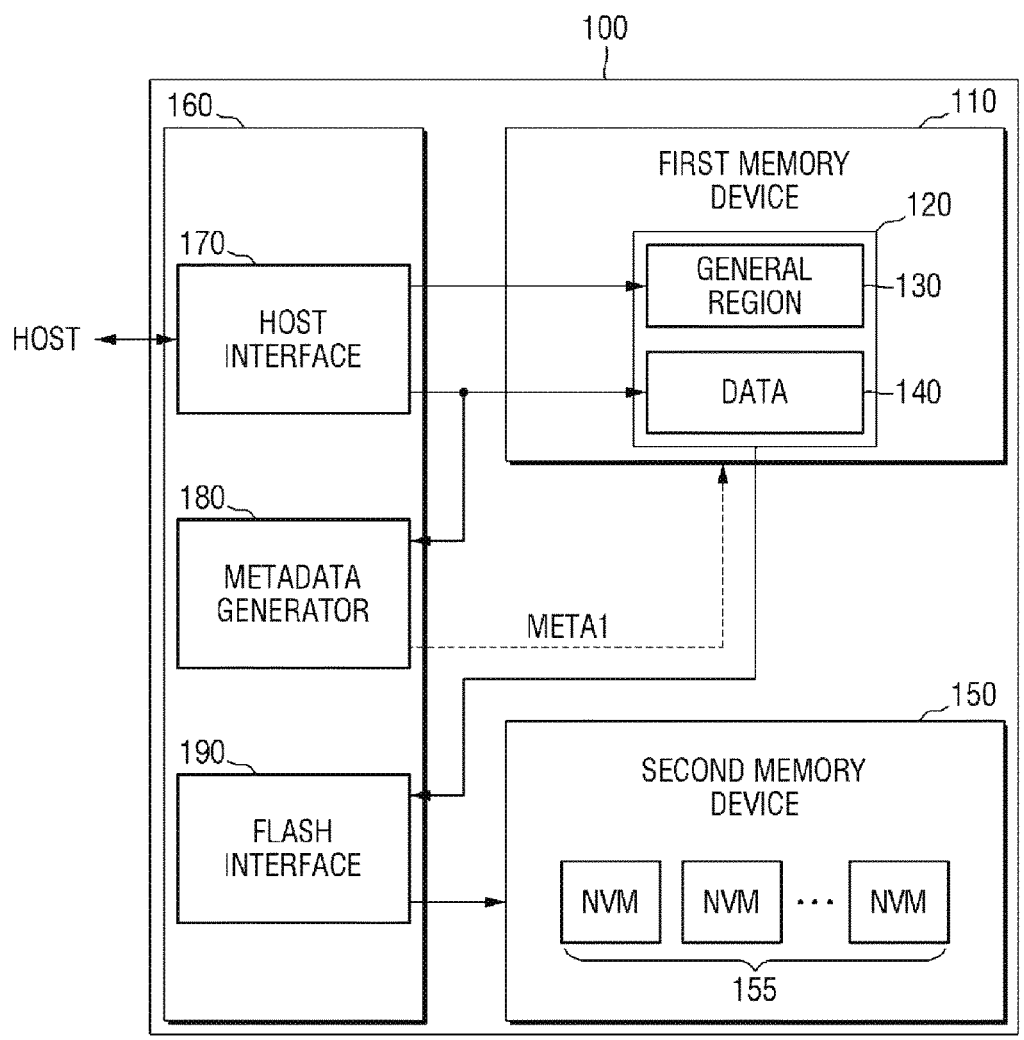
FIGS. 7a to 7b are block diagrams for explaining the operation of a data storage device according to some exemplary embodiments of the present inventive concept.
Figure 7B:
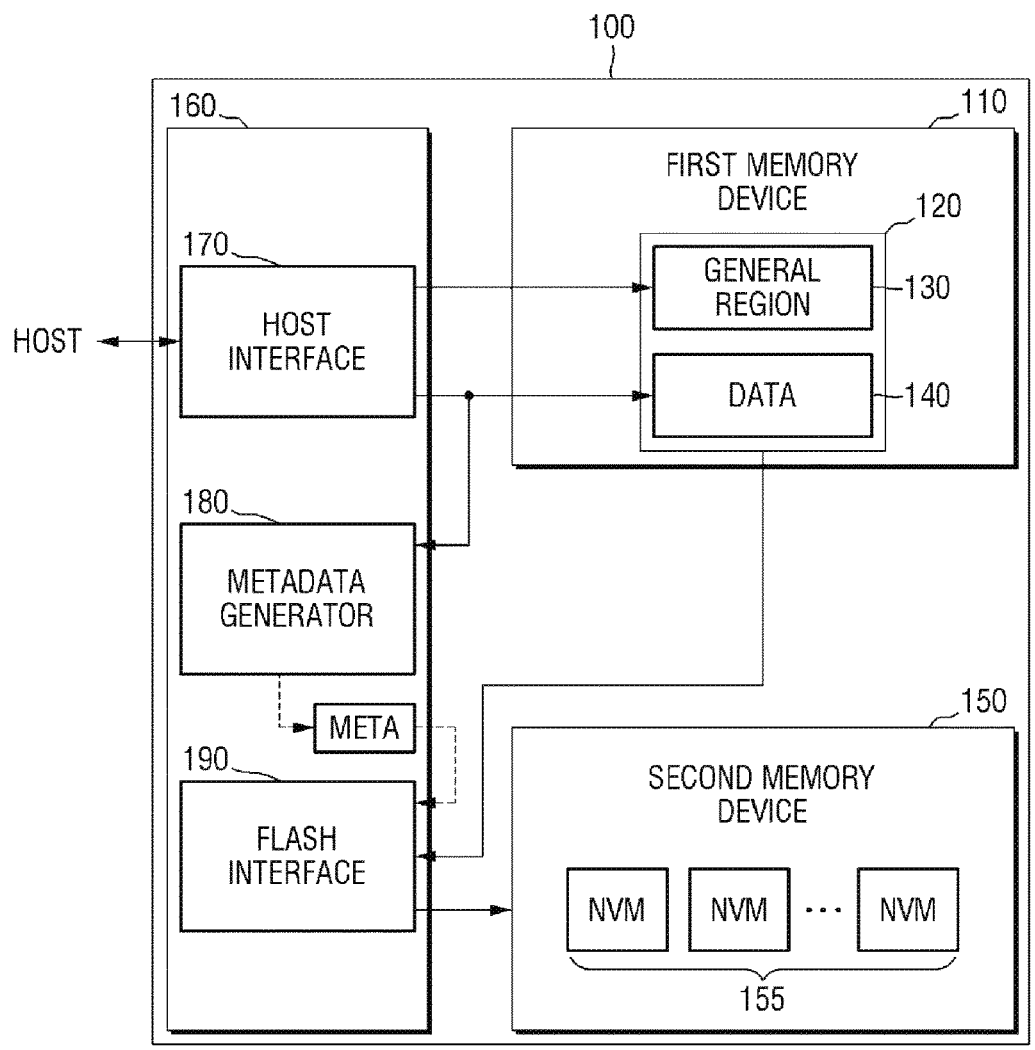

FIGS. 7a to 7b are block diagrams for explaining the operation of a data storage device according to some exemplary embodiments of the present inventive concept.

First, referring to FIG. 7a, the metadata generator 180 provides the generated metadata (META1) to the first memory device 110. The first memory device 110 may store the metadata (META1) provided from the metadata generator 180.

In an exemplary embodiment, the first memory device 110 stores the metadata (META1) in the buffer region 120. In an exemplary embodiment, the first memory device 1100 stores the metadata (META1) in the host access region 140.

In an exemplary embodiment, when the first memory device 110 stores the metadata (META1) in the host access region 140, the first memory device 110 provides the data (DATA1) and the metadata (META1) to the flash interface 190 in order to store the data (DATA1), which is provided from the host, in the second memory device 150. The metadata (META1) may be used to perform an error correction operation on the data (DATA1).

In an exemplary embodiment, the first memory device 110 also stores the metadata (META1) in regions other than the buffer region 120.

Referring to FIG. 7b, the controller 160 also stores the metadata (META1) generated by the metadata generator 180. The controller 160 may include another memory for storing the metadata (META1) generated by the metadata generator 180.

When the controller 160 stores the metadata (META1), the controller 160 may provide the metadata (META1) to the flash interface 190 like the configuration in which the first memory device 110 transmits the data (DATA1), which is provided from the host, to the flash interface 190.

Figure 8:
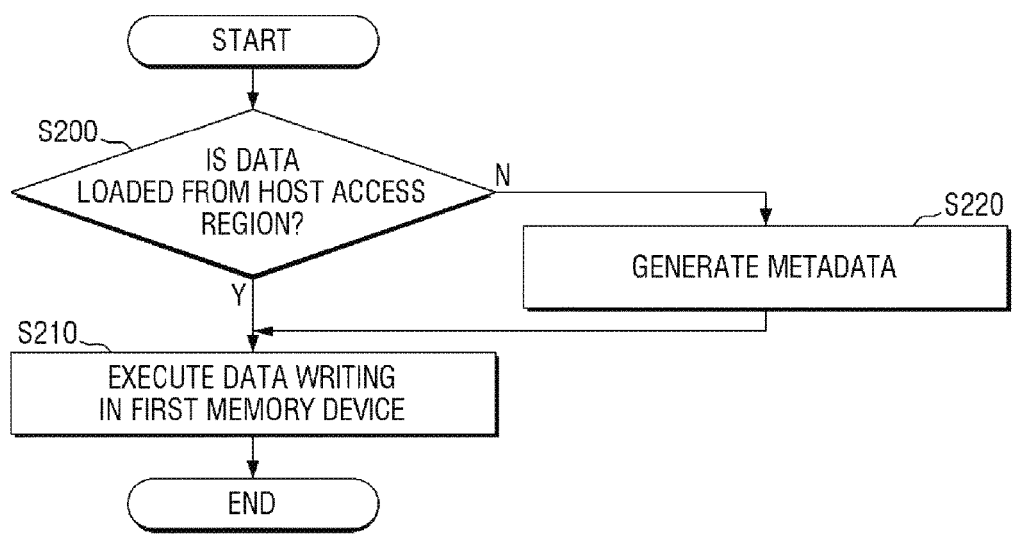
FIG. 8 is a flowchart for explaining the operation of the data storage device according to an exemplary embodiment of the present inventive concept.

FIG. 8 is a flowchart for explaining the operation of the data storage device according to an exemplary embodiment of the present inventive concept.

Referring to FIG. 8, an operation for storing data, which is stored in the first memory device 110, in the second memory device 150 will be described. First, it is determined whether the data provided from the first memory device 110 is data loaded from the host access region 140 (S200). When it is determined that the data is loaded from the host access region 140, the data writing is executed on the second memory device 150 (S210). For example, the load data is written to the second memory device 150. When it is determined that the data is not loaded from the host access region 140 (e.g., it is loaded from the general region 130), the metadata is generated from the loaded data (S220), and then the data writing is executed on the second memory device 150 (S210). For example, the metadata is generated from the loaded data and sent to the controller 160, and then the loaded data is written to the second memory device 150.

Figure 9:
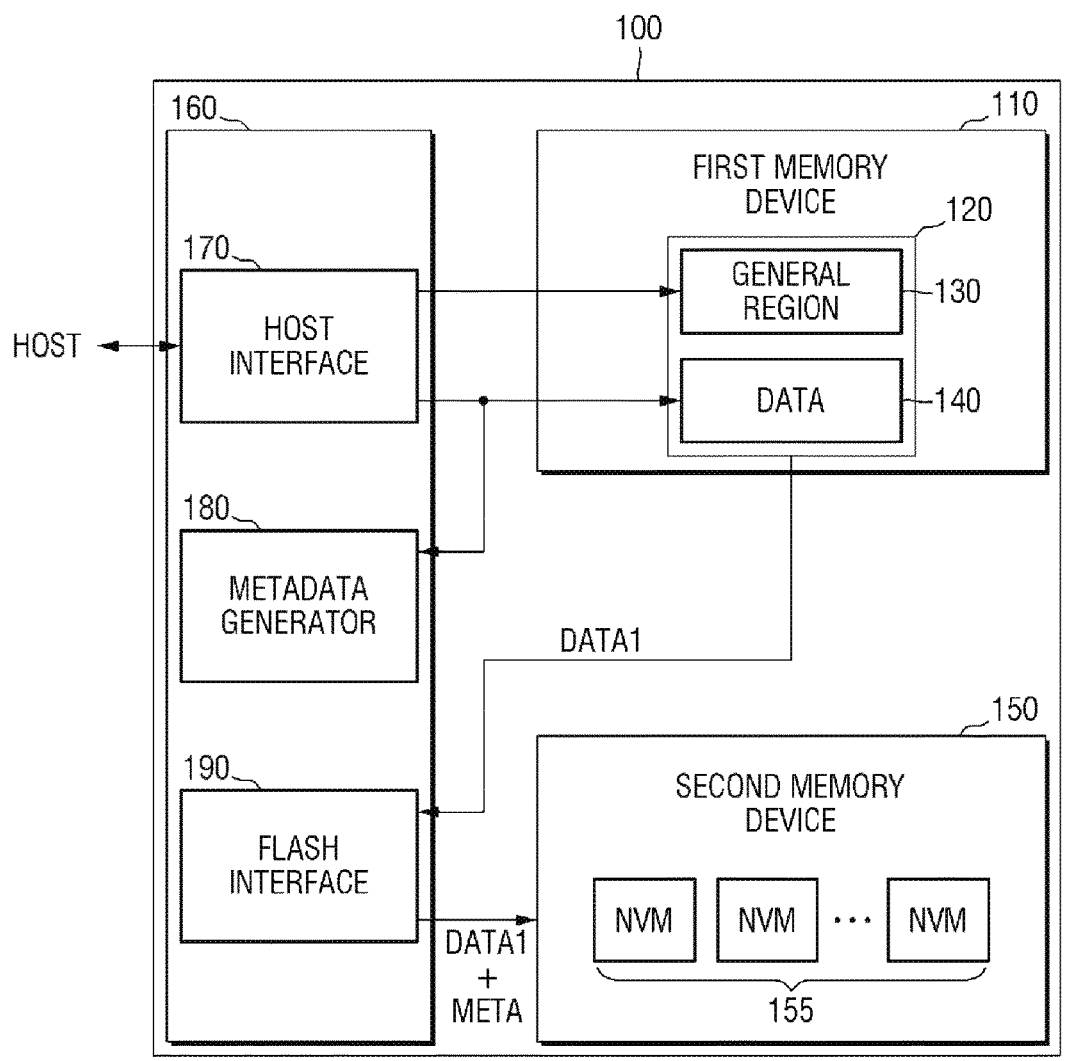
FIGS. 9 to 10 are block diagrams for explaining the operation of the data storage device according to exemplary embodiments of the present inventive concept.
Figure 10:
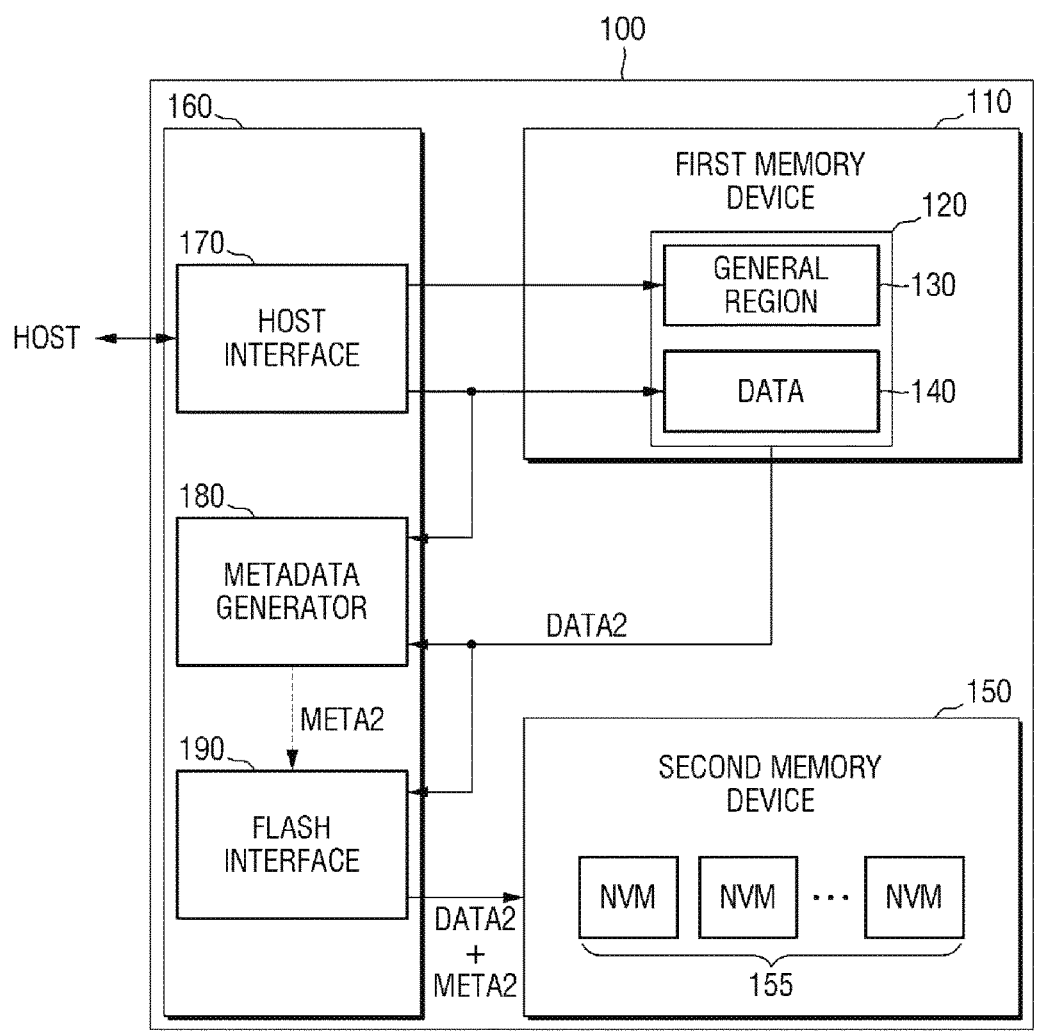

FIGS. 9 through 10 are block diagrams for explaining the operation of the data storage device according to some exemplary embodiments of the present inventive concept.

Referring to FIG. 9, the operation of writing data loaded from the host access region 140 on the second memory device 150 is illustrated.

In an exemplary embodiment, movement of the data stored in the first memory device 110 to the second memory device 150 is started by receiving another command from the host (e.g., a command other than the initial write command). In an exemplary embodiment, movement of the data stored in the first memory device 110 to the second memory device is automatically started, without receiving another command from the host.

The data (DATA1) loaded from the host access region 140 may be provided to the flash interface 190. When the metadata (META1) generated by the metadata generator 180 is stored in the first memory device 110, the first memory device 110 may provide the data (DATA1) and the metadata (META1) to the flash interface 190.

In another embodiment, when the controller 160 includes another memory that stores the metadata (META1), the metadata (META1) loaded from the memory is provided to the flash interface 190.

The data storage device 100 according to an exemplary embodiment of the present inventive concept includes a first memory device 110 that can be directly accessed by the host. Since the data storage device 100 generates metadata (META1) based on the data (DATA1) provided to the first memory device 110 and moves the data (DATA1) to the second memory device 150, the data (DATA1) and the metadata (META1) do not need to be copied to a space other than the buffer region 120 of the first memory device 110.

For example, generation of the metadata (META1) based on data (DATA1) provided by the host may involve calculation of an RS code or an LDPC as described above. When the data provided by the host and stored in the first memory device 110 has different data chunk sizes or data alignment sizes constituting data, the metadata generation may not be continuously performed. Therefore, it may be necessary to copy the data provided from the host to a portion in the first memory device 110 other than the buffer region 120 (for example, by a memcopy operation), and generate the metadata using the copied data.

In the data storage device 100 according to an exemplary embodiment of the present inventive concept, the buffer region 120 is allocated to the first memory device 110, and the buffer region 120 includes the host access region 140 which is directly accessed by the host. Further, data that can be stored in the host access region 140 may be limited by predetermined conditions. These conditions may include, for example, a chunk size, and a data alignment size.

Assuming that only limited data is stored in the host access region 140 under a predetermined condition, the metadata generator 180 may continuously generate metadata for the data stored in the host access region 140. That is, the metadata (META1) may be generated from the received data (DATA1), without the need to copy the data received from the host to a portion of the first memory device 110 other than the buffer region 120. Therefore, the operation of storing the data received from the host in the access region 140 and storing the data in the second memory device 150 together with its corresponding metadata can be performed quickly.

Referring to FIG. 10, the operation of writing data loaded from the general region 130 on the second memory device 150 is illustrated.

Referring to FIG. 10, when it is necessary to write data stored in the general region 130 to the second memory device 150, data (DATA2) is loaded from the general region 130, and the data (DATA2) is provided to the metadata generator 180 to generate metadata. In this process, there may be a need for an operation of copying the data (DATA2) stored in the general region 130 to a space other than the buffer region 120 of the first memory device 110. The reason is that, unlike the data stored in the host access region 140, the data (DATA2) stored in the general region 130 is not required to satisfy predetermined conditions, and may have a configuration of different data chunk sizes or data alignment sizes.

The flash interface 190 provides the data (DATA2) provided from the first memory device 110 and the metadata (META2) provided from the metadata generator 180 to the second memory device 150. The second memory device 150 stores the provided data (DATA2) and the metadata (META2).

Figure 11:
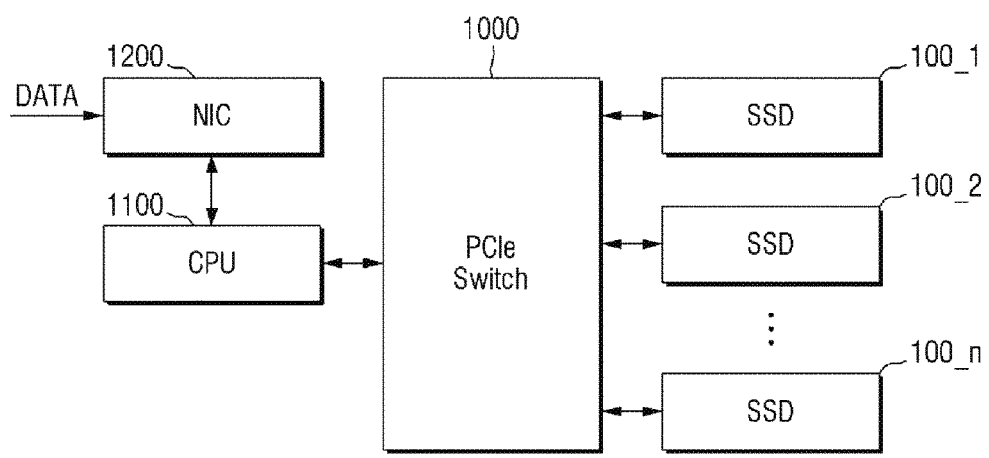
FIG. 11 is a block diagram illustrating a computing system including the data storage device according to an exemplary embodiment of the present inventive concept.

FIG. 11 is a block diagram illustrating a computing system including a data storage device according to an exemplary embodiment of the present inventive concept.

Referring to FIG. 11, the computing system includes a central processing unit (CPU) 1100, a Network Interface Card (NIC) 1200, and a plurality of SSDs 100_1 to 100_n connected to the PCIe switch 1000.

The NIC 1200 may data from an outside source. The NIC 1200 is connected to the plurality of SSDs 100_1 to 100_n through the PCIe switch 1000. Unlike the configuration illustrated in FIG. 11, the NIC 1200 is also connected to the PCIe switch 1000 through the CPU 1100, by being directly connected to the CPU 1100.

The plurality of SSDs 100_1 to 100_n may be the data storage device 100 of the present inventive concept described above with reference to FIGS. 1 to 10. Accordingly, each of the plurality of SSDs 100_1 through 100_n may include a first memory device 110, a second memory device 150, and a controller 160, respectively.

The NIC 1200 may directly access the first memory device 110 inside the SSD (e.g., 100_1) through the PCIe switch 1000. The NIC 1200 may store the data provided from the outside source in the host access region 140 of the SSD 100_1. The aforementioned data may be data complying with the predetermined conditions, for example, the data chunk size or the data alignment size.

The SSD 100_1 may rapidly execute generation of metadata and storage in the second memory device 150, by storing data restricted by predetermined conditions in the host access region 140.

Although exemplary embodiments of the present inventive concept have been described above with reference to the attached drawings, those having ordinary knowledge in the technical field to which the present disclosure pertains understand that these embodiments may be implemented in other specific ways without changing the technical idea or essential features of the present disclosure.

What is claimed is:

1. A data storage device comprising:
   a first memory device comprising a buffer region including a general region and a host access region, wherein the first memory device is directly accessible by a host;

a second memory device; and
a controller which controls the first memory device or the second memory device to store data received from the host,
wherein the controller stores the data in the host access region and generates metadata based on the data, when the data provided from the host complies with a predetermined condition.

2. The data storage device of claim 1, wherein the controller stores the data stored in the host access region together with the metadata in the second memory device.

3. The data storage device of claim 2, wherein the controller does not store the data stored in the host access region in regions other than the buffer region of the first memory device.

4. The data storage device of claim 1, wherein the first memory device stores kernel data in the general region, and
the first memory device stores application data or user data in the host access region.

5. The data storage device of claim 1, wherein the first memory device is a volatile memory, and the second memory device is a nonvolatile memory.

6. The data storage device of claim 1, wherein the buffer region is a Controller Memory Buffer (CMB).

7. The data storage device of claim 1, wherein the metadata includes an Error Correction Code (ECC).

8. The data storage device of claim 1, wherein the controller stores the data in the general region when data received from the host does not comply with the predetermined condition.

9. The data storage device of claim 8, wherein the controller loads the data stored in the general region, generates metadata based on the loaded data, and stores the loaded data and the metadata in the second memory device.

10. A data storage device comprising:
a host which provides a data write command and data written by the data write command;
a drive which stores the data provided from the host; and
a switch which connects the host and the drive,
wherein the drive comprises:
    a first memory device comprising a buffer region including a general region and a host access region, wherein the first memory device is directly accessible by the host,
    a second memory device; and
    a controller which controls the first memory device or the second memory device to store the data provided from the host,
wherein, when the data provided from the host complies with a predetermined condition, the controller stores the data in the host access region and generates metadata based on the data.

11. The data storage device of claim 10, wherein the switch includes a Peripheral Component Interconnect Express (PCIe) switch.

12. The data storage device of claim 10, wherein the drive is a Solid State Drive (SSD).

13. The data storage device of claim 12, wherein the first memory device is a volatile memory, and the second memory device is a nonvolatile memory.

14. The data storage device of claim 10, wherein the controller stores the data in the general region, when data provided from the host does not comply with the predetermined condition.

15. The data storage device of claim 14, wherein the controller loads the data stored in the general region, generates the metadata based on the loaded data, and stores the loaded data and the metadata in the second memory device.

16. A method of operating a data storage device, the method comprising:
allocating, by a controller of the storage device, a first part of a buffer region included in a first memory device of the data storage device as a general region and a second part of the buffer region as a host access region;
receiving, by the controller, a write command and data from a host, the write command including an address of the first memory device;
storing, by the controller, the data in the host access region, and generating metadata based on the data, when the data complies with a predetermined condition;
storing, by the controller, the data in the general region of the first memory device, when the data does not comply with the predetermined condition; and
storing, by the controller, the data stored in the host access region together with the metadata in a second memory device.

17. The method of claim 16, further comprising:
loading, by the controller, data stored in the general region of the first memory device;
generating, by the controller, metadata based on the loaded data; and
storing, by the controller, the loaded data and the metadata of the loaded data in the second memory device.

18. The method of claim 16, wherein the data stored in the host access region is not stored in regions other than the buffer region of the first memory device.

19. The method of claim 16, wherein the buffer region is a Controller Memory Buffer (CMB).

20. The method of claim 19, wherein the metadata includes an Error Correction Code (ECC).

* * * * *